United States Patent [19]

Buchanan

[11] 3,911,378

[45] Oct. 7, 1975

[54] TTL GATE VOLTAGE CONTROLLED CRYSTAL OSCILLATOR

[75] Inventor: James E. Buchanan, Bowie, Md.

[73] Assignee: Westinghouse Electric Corporation, Pittsburgh, Pa.

[22] Filed: Sept. 25, 1974

[21] Appl. No.: 509,170

[52] U.S. Cl........... 331/116 R; 331/108 C; 331/159

[51] Int. Cl.²........................................ H03B 5/36

[58] Field of Search............ 331/116, 108, 159, 158

[56] References Cited

UNITED STATES PATENTS 3,512,106 5/1970 Rosenthal.......................... 331/116

OTHER PUBLICATIONS

EEE - Jan. 1968, pp. 116–117.

Electronic Design 16, Aug. 1, 1968, p. 82.

Electronic Design 17, Aug. 17, 1969, p. 242.

*Primary Examiner*—John Kominski

*Attorney, Agent, or Firm*—D. Schron

[57] ABSTRACT

A voltage controlled crystal oscillator employing three series-connected TTL inverting gates. Two resistor and capacitor time constant circuits are connected in circuit with one TTL inverting gate and provide a 360° phase shifter, further connected in parallel with a crystal. The two further TTL inverting gates in series connection with the first provide self-start of oscillations, and during operation provide a second 360° phase shifter, acting in parallel with the first. The output is derived from the second shifter circuit, conveniently through a fourth TTL inverting gate. Two varactor diodes provide the capacitance of the resistor/capacitor phase shift circuits. Frequency control is afforded by varying the voltage supplied to the diodes. The oscillator is self starting and exhibits the stability characterized by crystal oscillators while also offering external voltage control of the frequency of oscillation.

11 Claims, 9 Drawing Figures

TTL GATE VOLTAGE CONTROLLED CRYSTAL OSCILLATOR

BACKGROUND OF THE INVENTION

Oscillators using logic gates are in general of two types, phase shift oscillators and time delay oscillators. In time delay oscillators, the output of one gate is coupled to the input of a second gate through a time delay. The output of the second gate is coupled back to the input of the first gate and may incorporate yet another time delay. In phase shift oscillators, the output of a logic gate is coupled back to its input through circuitry which establishes a loop phase shift of 360° and integer multiples thereof. An inverting logic gate produces in itself a phase shift of 180° and operates essentially in one of two states, either "on" or "off." The logic gate of the transistor-transistorlogic (TTL) family incorporates amplifiers which drive to controlled saturation or to turn off, depending on the input voltage level. Beyond some threshold of input voltage, the TTL inverter gate is either off for an input voltage exceeding the threshold, or on for an input voltage less than the threshold, and thus operates substantially as a binary element having only two states. Prior to switching from one state to the other, however, the TTL gate exhibits somewhat linear amplifier effects having gain considerably in excess of unity. The conditions of a 360° loop phase shift and loop gain of unity or greater are necessary for phase shift oscillator operation.

The frequency of oscillation of a phase shift oscillator is determined either by a crystal element, or by discrete resistor (R), capacitor (C), or inductor (L) elements, or a combination of these. The crystal element offers excellent frequency stability owing to its very narrow band width properties and as a consequence the frequency of the oscillator cannot be varied under external control. Separate RLC elements afford the possibility of frequency variation but do not offer the degree of frequency stability realized with a crystal.

The present invention overcomes these drawbacks of prior art circuits and by a unique configuration of a crystal with RC and TTL gate elements, affords an oscillator having advantageous characteristics of both crystal and RC types.

SUMMARY OF THE INVENTION

In the present invention, a 360° phase shift circuit is comprised of RC and TTL inverter gate elements, and a crystal is connected in parallel therewith. The RC elements effectively pull the natural frequency of the crystal under controlled conditions. The capacitive element (C) is provided by a varactor diode which has its capacitance varied by an externally applied voltage. Two such RC circuits produce a controlled 180° phase shift. A single inverting TTL gate produces another 180° of phase shift and, when connected in series with the RC circuits, yields the necessary 360° of loop phase shift.

The capacitive elements preferably are varactor diodes which are variable under external voltage control. A further 360° phase shift loop comprising two TTL inverting gates in series is connected in parallel with the first 360° phase shift circuit. The three inverting TTL gates are connected in series and present an unstable configuration, assuring self-starting. Also as a matter of utility, a fourth TTL gate, as is commonly provided in a given IC package configuration, is used in the output circuit of the oscillator.

Thus, a simple low-cost voltage controlled oscillator is built around four TTL logic gates, a crystal element and two RC circuits, the capacitance of each of which is provided by varactor diodes controlled with an external voltage. The circuit, though not highly linear or stable, is more than adequate for many system applications, and is especially well suited for applications where low cost is imporatnt and the operating temperature range is limited. Such an application exists, for example, where a test circuitry clock would have to be locked to a system clock via a phase lock loop. The circuit is extremely low cost in its implementation, adapts well to digital applications, and offers variations in design according to the particular digital system requirements.

Further advantages of the present invention include direct TTL compatibility in output voltage levels, low cost (the crystal being the most expensive single element), small size, and use of standard digital system supply voltages. Frequency control of the oscillator is readily achieved using the zero to +5 volts required of TTL gates. A very small amount of printed circuit board area is required for mounting the components of the oscillator. The components, excluding the crystal element, can be mounted in the area normally occupied by two dual-in-line integrated circuit packages. Only one dual-in-line package is required for the active TTL gate. No large inductors or capacitors are required.

DETAILED DESCRIPTION OF THE INVENTION

Figure 1:
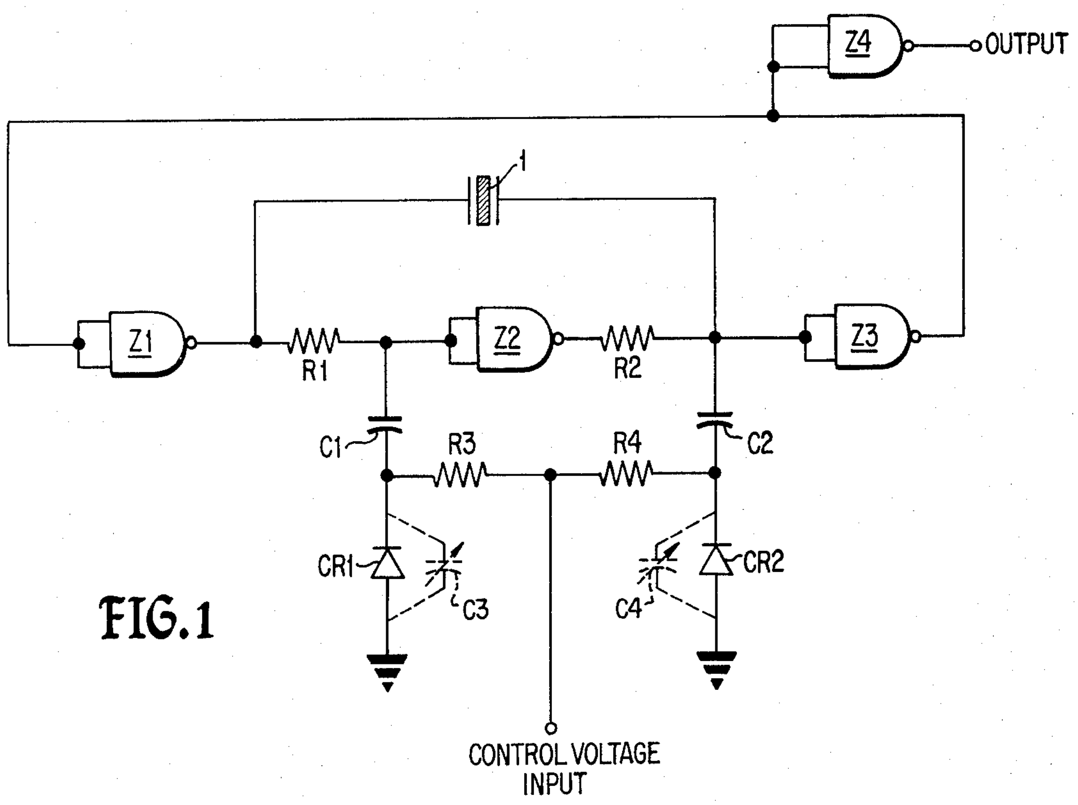
FIG. 1 is a block diagram of the voltage controlled crystal oscillator.

With reference to FIG. 1, three inverting gates Z1, Z2 and Z3 are connected in series and provide an unstable configuration, assuring oscillator start-up. Each gate provides 180° of phase shift and three gates in series then offer 540° of phase shift. The small signal AC gain of each gate is greater than one in the frequency range of interest, meeting an essential requirement for oscillation.

Another requirement for oscillation is that the loop phase shift of the series circuit comprised of gates Z1, Z2 and Z3 be 360° or an integer multiple thereof.

Figure 2A:
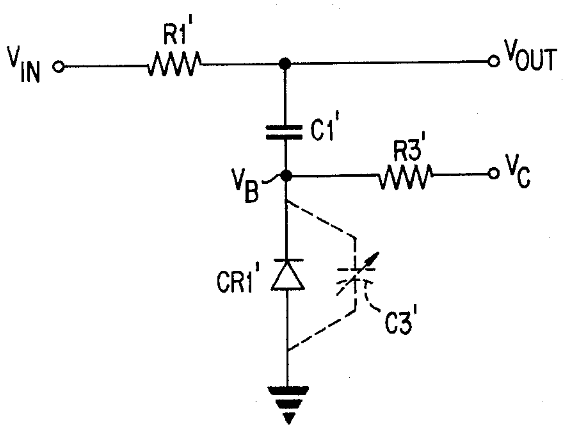
FIGS. 2A and 2B show the resistor and capacitor elements of the RC portion of the phase shift circuitry and, in particular, show the capacitive effects of the varactor diodes.
Figure 2B:
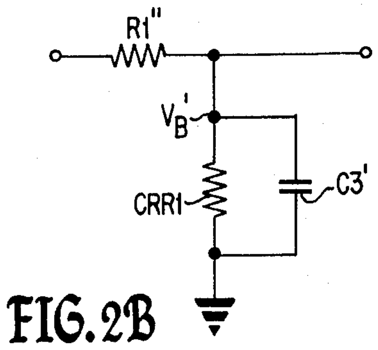

The varactors CR1 and CR2 present capacitances C3 and C4, respectively, and, with resistors R1 and R2, as shown in FIGS. 2A and 2B, form corresponding RC phase shift circuits, at the input and output of gate Z2. Referring to FIG. 2A, the capacitance of each RC circuit is actually $C_1'$ and $C_3'$ in series, with a net capacitance determined by $$C_{net} = \frac{C_1' \quad C_3'}{C_1' \quad + \quad C_3'}$$

For $C_1'$ much larger than $C_3'$, i.e., 10 times or more, the value of $C_{net}$ becomes essentially the value of $C_3$. In one particular application, $C_1'$ is typically 0.01 $\mu$ farad and $C_3'$ is 56 $p$ farad nominally. A similar relationship exists between $R_1'$ and $R_3'$, ($R_3$ and $R_4$ being high in resistance value to provide isolation between the high frequency section and the low frequency control input), such that $R_1'$ predominates; the RC circuit thus can be viewed as shown in FIG. 2B, to comprise the resistor $R_1''$, equal substantially to $R_1'$, capacitor $C_3''$ of the varactor and a parallel resistor $CRR_1$, also of the varactor. With the proper voltage polarity bias applied to the varactor, the value of $CRR_1$ is also considerably larger than the value of $R_1''$ and the circuit reduces to just $R_1''$, and $C_3''$ in series.

The inherent capacitance $C_3''$ of the varactor is variable according to the bias, or control, voltage applied. Referring to FIG. 1, the control voltage is applied to resistors $R_3$ and $R_4$ and isolated from the gates by capacitors $C_1$ and $C_2$. In FIG. 2A, the control voltage $V_C$ produces the bias voltage $V_B$ according to the division of voltage produced by $R_3'$ in series with $CR_1$ and in particular the resistance value $CRR_1$ thereof, shown in FIG. 2B. The effect of changes in the control voltage on oscillator frequency is presented subsequently.

Figure 3A:
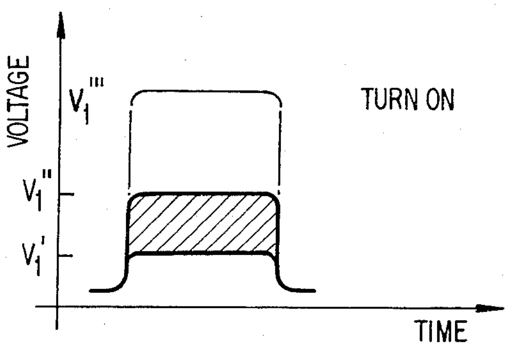
FIGS. 3A, 3B and 3C show the voltage conditions necessary to switch the logic states of the TTL gates.
Figure 3B:
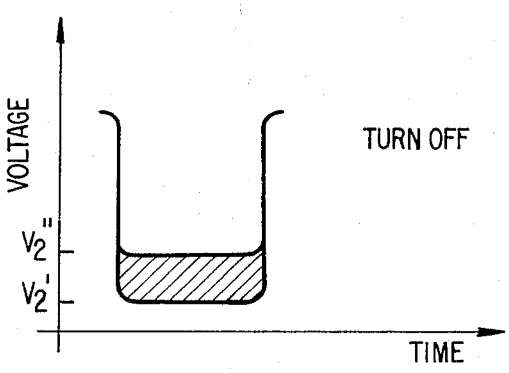
Figure 3C:
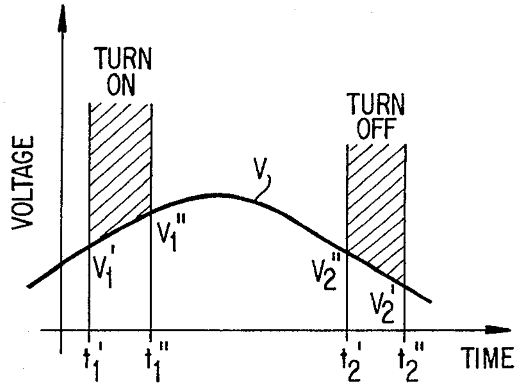

The phase shift exhibited by the RC combination is normally determined in relationship to the frequency of the voltage applied. In connection with a logic gate of the transistor-transistor-logic (TTL) family, the time constant of the RC circuit is the prime concern in determining the condition of threshold voltage for gate switching. In FIG. 3A, a range of switching voltages is shown between lower and upper limits $V_1'$ and $V_1''$, which are effective to turn on a logic gate. The voltage may range up to a value $V_1''$ corresponding to the maximum circuit voltage (e.g. the output of a logic gate in series with the input of a similar logic gate). In FIG. 3B, conditions of logic gate turn-off are illustrated, showing again a range between $V_2'$ and $V_2''$. Differences in voltages $V_1$ for turn-on and V for turn-off illustrate a hysteresis effect common in TTL devices. Applying a variable voltage V as shown in FIG. 3C produces turn-on and turn-off times for a logic gate occurring in times $t_1'$ to $t_1''$ and times $t_2'$ to $t_2''$, respectively. The signal waveforms relating to the logic gates and RC circuits of FIG. 1 are discussed next.

Figure 4A:
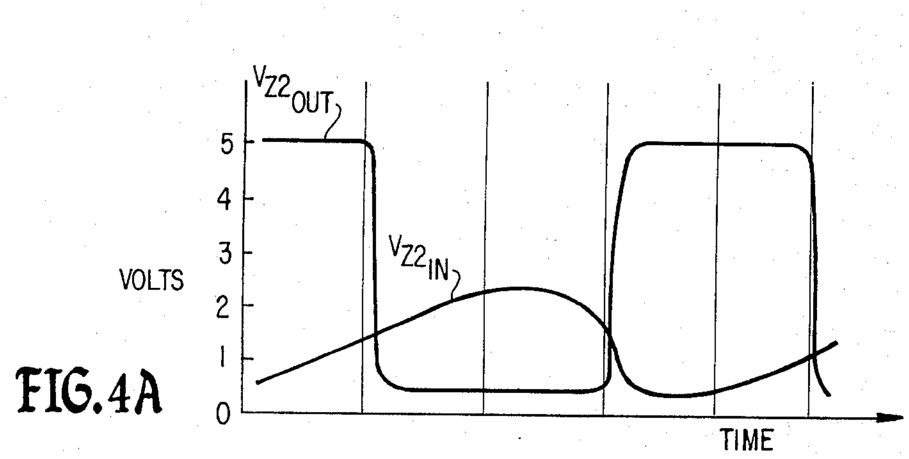
FIGS. 4A, 4B and 4C show the waveforms of the signals occurring at significant junctions in the circuitry of the voltage controlled crystal oscillator.
Figure 4B:
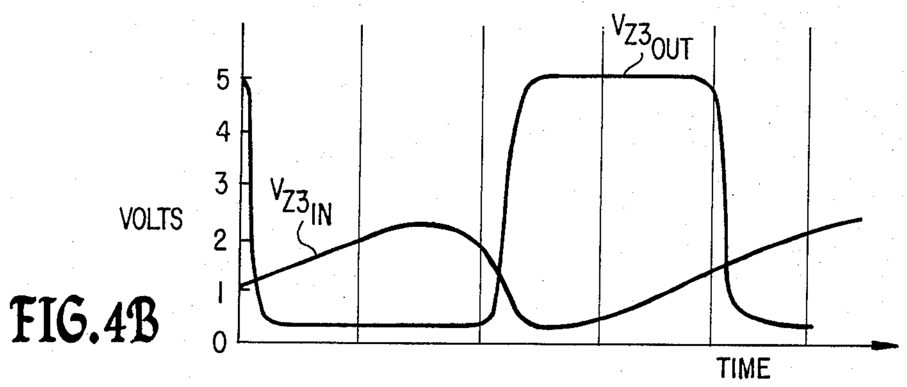
Figure 4C:
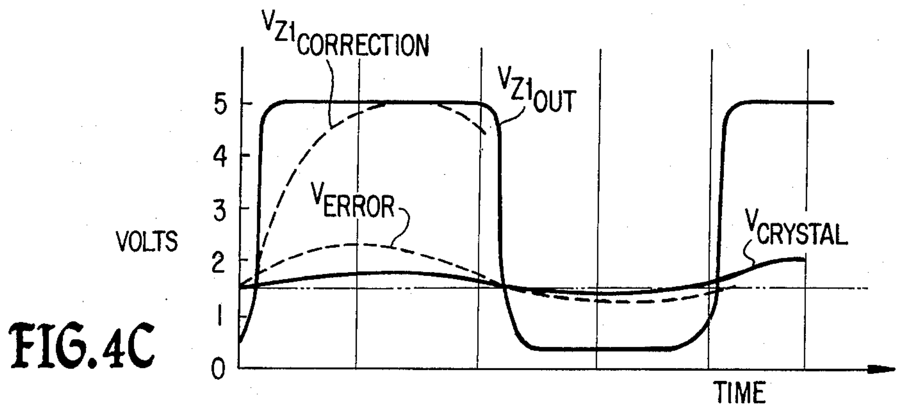

The voltage waveforms of FIGS. 4A, 4B and 4C are presented to facilitate a discussion of the effects of the RC and crystal circuits. Nominally, the output of a logic gate is a square waveform determined in switching times by the voltage levels or logic states of the input signal, as discussed previously. If, however, the output of a logic gate is loaded with an RC circuit, the output waveform will depart from the nominal square waveform. In FIG. 1, gate Z2 is loaded into resistor R2 which should present a high enough resistance to have a minimal effect on the output waveform, as shown in FIG. 4A for $V_{Z2out}$. The switching times of the output signal $V_{Z2out}$ are determined by the input signal $V_{Z2in}$ shown in FIG. 4A. This signal is greatly affected by the RC circuit composed of $R_1$ and $CR_1$ shown in FIG. 1. A similar set of signals applies to gate $Z_3$ of FIG. 1, as shown in FIG. 4B. In this case, the waveform of $V_{Z3in}$ is affected by the RC circuit composed of $R_2$ and $CR_2$ of FIG. 1. The waveform of the input signal to gate $Z_1$ is the same as the output of gate $Z_3$ due to the straight wire connection as shown in FIG. 1.

The output of gate Z1 is also nominally a square wave $Z_{1out}$ as seen in FIG. 4C at the oscillator frequency, and the voltage across the crystal $V_{crystal}$ in FIG. 4C is nearly zero conforming to the consequence of a 360° phase shift. As the oscillator frequency tends to increase or decrease from the controlled frequency of the crystal, however, the output of gate $Z_1$ departs from a square wave due to the effects of both the RC circuit and the crystal 1 as shown for $V_{Zcorrection}$ in FIG. 4C. In this case, the crystal, acting as a bandpass filter, introduces an error voltage $V_{error}$ in FIG. 4C in feedback to gate $Z_2$, tending to correct the oscillator frequency and maintain it at the crystal frequency, i.e., its series resonant frequency.

The waveforms throughout the oscillator of FIG. 1 must conform to the voltage vector summation from point to point. Therefore, voltage $V_{crystal}$ (i.e., the voltage across the crystal) is the voltage vector difference between voltage $V_{Z1out}$ and $V_{Z3in}$ as given in FIGS. 4B and 4C. Each logic gate attempts to reach either an on or an off state, i.e., an inversion of the respective input logic states, and as a consequence produces a phase shift of 180°. The effect of the phase shifts caused by the RC circuits is quite apparent; as may be observed in FIGS. 4A and 4B, there exists a resultant phase difference of only 90° between gates $Z_2$ and $Z_3$. Similarly, only 90° phase difference exists between gates $Z_1$ and $Z_2$, as shown in FIGS. 4A and 4C. Note that a phase difference of 180° occurs between gate $Z_1$ output ($V_{Z1out}$) and gate $Z_3$ output ($V_{Z3out}$) as shown in FIGS. 4C and 4B, respectively. Following the path of signals through the gates beginning with the output of gate $Z_1$, it is seen that there is actually a 360° phase shift between gate $Z_1$ output and gate $Z_3$ input. This is shown by observing in FIGS. 4A, 4B and 4C a 90° phase shift from $V_{Z1out}$ to $V_{Z2in}$, a 180° phase shift from $V_{Z2in}$ to $V_{Z2out}$ and a 90° shift from $V_{Z2out}$ to $V_{Z3in}$, all in reference to FIGS. 4A, 4B and 4C. This is one of the conditions (i.e., 360° phase shift) required for oscillation. The other condition of circuit gain greater than one is met by the inherent design of the TTL gates -- here, especially gate $Z_2$.

The value of $R_1$ and $R_2$ and the capacitance of $CR_1$ and $CR_2$ are not critical for oscillator operation, that is, for the oscillator to run. The values of $R_1$, $R_2$, $CR_1$ and $CR_2$, however, are selected so that the oscillator operates at a frequency somewhat above the crystal frequency, without the crystal in place, by some 20 to 90 percent. Limiting the natural frequency of the gates $Z_1$, $Z_2$ and $Z_3$ to less than twice the fundamental frequency of the crystal prevents second harmonic operation.

The general frequency range of the voltage controlled oscillator is from 1mHz to 20 mHz and depends on the type of TTL gate used. Selection is possible from the TTL family logic using low power 54L00 types, standard 5400 types and high speed gates such as 54H00 and 54S00. For a given crystal frequency, a controlled amount of frequency change is possible by varying the capacitance of $CR_1$ and $CR_2$. Laboratory results using a 6.00 MHz AT cut crystal, 54H04 TTL inverter and 1N5453 varactors at 25° C temperature produced the following frequencies of oscillation, as a function of control voltage:

| CONTROL VOLTAGE | FREQUENCY |
|---|---|
| 0 volts | 5,998,810 Hz |
| 1 | 5,999,508 |
| 2 | 5,999,591 |

-Continued

| | |
|---|---|
| 3 | 5,999,620 |
| 4 | 5,999,652 |
| 5 | 5,999,667 |
| 6 | 5,999,680 |
| 7 | 5,999,690 |
| 8 | 5,999,700 |

The 1N5453 varactor exhibits a capacitance of 56 $p$ farad at 4 volts. A larger range of frequency control may be obtained using a 1N5456 varactor which exhibits 100 $p$ farad capacitance at 4 volts.

For an application not requiring frequency control, fixed capacitors can be used in place of the varactors $CR_1$ and $CR_2$. In such an application, capacitors $C_1$ and $C_2$ and resistors $R_3$ and $R_4$ are not needed. Gate $Z_4$ in FIG. 1 is used to provide an isolation between the oscillator and the output circuitry, and affords the full loading permitted in one TTL gate output.

From the foregoing, it is to be appreciated that the oscillator of the invention is of extremely simple, small and inexpensive construction, yet affords the advantages of self-start operation, crystal stability and voltage control of frequency. The operating principle as set forth above, of course, is not critical to the understanding of the invention, but has been presented to assist the reader in understanding the interrelationships and operating characteristics of the circuit elements, as are believed to be brought about by the unique configuration of the present circuit. Of particualr significance is the unstable configuration of the three seriesconnected gates $Z_1$, $Z_2$ and $Z_3$ assuring self-start and the parallel 360° phase shifter afforded by gates $Z_1$ and $Z_3$ during operation, with gates $Z_1$ and $Z_3$ isolating the output from the oscillator, formed with gate $Z_2$, and from the crystal, and as well the isolation of the input control voltage. A significant principle of operation is found as well in relying on the turn-on and turn-off characteristics of the gates afforded in the disclosed embodiments by use of TTL logic inverter gates, and the phase shift characteristics of time constant circuits (RC) combined with the inversion of the gate $Z_2$ to provide a 360° phase shifter with greater than unity gain.

Numerous modifications and adaptations of the system of the invention will be apparent to those skilled in the art and thus it is intended by the appended claims to cover all such modifications and adaptations which fall within the true spirit and scope of the invention.

What is claimed is:

1. A crystal controlled oscillator employing first, second and third inverting logic gates each having greater than unity gain in its turn-on and turn-off regions of operation, comprising:

a first 360° phase shift circuit having input and output terminals and including said second inverting logic gate, and first and second resistor-capacitor time constant circuits connected respectively between the input terminal of said phase shift circuit and the input of said second logic gate, and between the output of said second logic gate and the output terminal of said phase shift circuit, the resistor-capacitor values of said time constant circuits being selected with respect to the turn-on characteristics of operation of said second logic gate to afford the said 360° phase shift, a crystal connected between said input and output terminals of said first 360° phase shift circuit, a second 360° phase shift circuit including said first and third inverting logic gates connected in series between the input and output terminals of said first 360° phase shift circuit, and means for deriving an oscillation output from said second 360° phase shift circuit.

2. An oscillator as recited in claim 1 wherein said output deriving means comprises a fourth said logic gate connected at its input to the series connection of said second and third logic gates and providing an oscillation output at the output thereof.

3. An oscillator as recited in claim 1 wherein said capacitors of said first and second time constant circuits are afforded by the inherent capacitance of first and second varactor diodes, and there is further provided means for applying an external control voltage to said varactor diodes to vary the effective capacitance thereof and thereby the frequency of oscillation of said oscillator.

4. An oscillator as recited in claim 3 wherein there are further provided coupling capacitors for connecting said varactors to the inputs of said second and third logic gates, respectively, to isolate the control voltage from the high frequency oscillations of said oscillator.

5. An oscillator as recited in claim 1 wherein each of said inverting logic gates comprises a TTL gate.

6. A crystal controlled oscillator comprising:

first, second and third inverting logic gates connected in series, each having greater than unity gain in its turn-on and turn-off regions of operation, first and second time constant circuits connected in circuit respectively between the first and second, and between the second and third said logic gates, and affording with the phase shift of said second logic gate approximately 360° phase shift at a desired frequency of oscillation of said oscillator, said first and third logic gates affording a corresponding said 360° phase shift between the output of said first gate and the input of said second gate, and a crystal, having a series resonant oscillation at said desired frequency, connected to said first and second time constant circuits at the output of said first logic gate and the input of said third logic gate, said first time constant circuit responding to the output of said first gate to control turn-on of said second logic gate and said second time constant circuit responding to the turn-on of said second logic gate to control turn-on of said third logic gate, said crystal responding to a phase difference of other than 360° between the output of said third logic gate and the input of said first logic gate at the desired frequency of oscillation to produce an oscillation output at said desired frequency supplied with the output of said second logic gate and through said first time constant circuit to the input of said second logic gate to control the time of switching thereof, and thereby to maintain oscilaltions in said oscillator at said desired frequency.

7. An oscillator as recited in claim 6 wherein there is further provided means for varying the time constant values of said time constant circuits to alter the actual frequency of oscillation from said desired frequency.

8. An oscillator as recited in claim 6 wherein each said time constant circuit includes resistive means connected in circuit with said gates and capacitance means connected between said resistive means and a reference potential.

9. An oscillator as recited in claim 8 wherein said capacitance means of said capactiors of said first and second time constant circuits are afforded by the inherent capacitances of first and second varactor diodes, and there is further provided means for applying an external control voltage to said varactor diodes to vary the effective capacitance thereof and thereby the frequency of oscillation of said oscillator.

10. An oscillator as recited in claim 6 wherein said output deriving means comprises a fourth said logic gate connected at its input to the series connection of said second and third logic gates and providing an oscillation output at the output thereof.

11. An oscillator as recited in claim 6 wherein each of said inverting logic gates comprises a TTL gate.

* * * * *